United States Patent [19]

Harwood et al.

[11] Patent Number: 5,237,267
[45] Date of Patent: Aug. 17, 1993

[54] WAFER PROBE STATION HAVING AUXILIARY CHUCKS

[75] Inventors: Warren K. Harwood; Paul A. Tervo, both of Vancouver, Wash.; Richard H. Warner, Portland, Oreg.

[73] Assignee: Cascade Microtech, Inc., Beaverton, Oreg.

[21] Appl. No.: 890,970

[22] Filed: May 29, 1992

[51] Int. Cl.[5] ...................... G01R 31/02; G01R 1/073
[52] U.S. Cl. .............................. 324/158 F; 324/158 P
[58] Field of Search ............... 324/158 F, 158 P, 72.5; 269/21

[56] References Cited

U.S. PATENT DOCUMENTS 3,710,251  1/1973  Hagge et al. ................... 324/158 P
5,077,523  12/1991  Blanz .............................. 324/158 F

OTHER PUBLICATIONS

Cascade Microtech, Inc., "Summit 9000 Series Analytical Probe Station," 1990.
Cascade Microtech, "Introducing the Peak of Analytical Probe Stations," *MicroProbe Update*, 1990, pp. 1–3.
Cascade Microtech, Inc., "Mechanical Operation," Summit 9000 Analytical Probe Station, 1990, pp. 3–8 to 3–9.

Primary Examiner—Ernest F. Karlsen
Attorney, Agent, or Firm—Chernoff, Vilhauer, McClung & Stenzel

[57] ABSTRACT

A wafer probe station has a wafer-supporting vacuum chuck, together with one or more substrate-supporting auxiliary vacuum chucks having independent vacuum controls for mounting contact substrates and calibration substrates simultaneously with the wafer. A detachable interconnection of the various chucks enables independent replacement of each chuck to accommodate various different chuck types, and also permits the elevations of the respective chuck surfaces to be adjusted relative to each other to compensate for differences in thicknesses between the wafer substrate and the calibration or contact substrates. The invention is especially useful in wafer probe stations equipped with enclosures for controlled-environment testing where a large variety of different wafer chucks must be readily interchangeable for testing under different conditions.

13 Claims, 6 Drawing Sheets

WAFER PROBE STATION HAVING AUXILIARY CHUCKS

BACKGROUND OF THE INVENTION

The present invention is directed to probe stations for making highly accurate measurements of high-speed, large scale integrated circuits at the wafer level, and of other electronic devices.

Such measurements require set-up and calibration steps using contact substrates and calibration substrates prior to and during the respective measurements. With most previous probe stations, the contact and calibration substrates, and the test wafer, cannot be mounted on a supporting chuck simultaneously, thus requiring repetitive time-consuming unloading and loading of the chuck between successive set-up, calibration, and measurement steps. In controlled-environment probe stations having hermetically-sealed enclosures for providing a dry environment for low-temperature testing, this problem is even worse because of the repetitive need to re-purge the enclosure with a dry gas and reestablish steady-state thermal conditions for each unloading and loading sequence.

These problems were partially alleviated with the introduction of the Summit 9000 TM probe station, manufactured by Cascade Microtech, Inc. of Beaverton, Oreg., which featured a square wafer chuck having a central wafer-supporting surface area and separately vacuum-controlled corner surface areas for holding a calibration substrate and a contact substrate simultaneously with a wafer. However the integral nature of this square wafer chuck left several problems unsolved. The central wafer-supporting surface area of the chuck could not be replaced with different types of surfaces having different metal plating, impedance characteristics, or thermal characteristics without also replacing the corner surface areas, nor could the respective elevations of the respective wafer or substrate-supporting surfaces be adjusted with respect to each other to compensate for differences in thicknesses between contact, calibration and wafer substrates. Moreover the placement of the separate vacuum control valves, for controlling the corner surface areas, directly on the square wafer chuck made it impractical to use the chuck in conjunction with a controlled-environment enclosure isolating the surface areas from outside influences such as electromagnetic interference (EMI), moist air, and/or light, because the enclosure would inhibit access to the valves.

SUMMARY OF THE PRESENT INVENTION

The wafer probe station of the present invention eliminates the foregoing deficiencies of prior probe stations by providing a modular chuck assembly comprising one or more auxiliary chucks, detachably interconnected with a wafer chuck, for supporting contact and calibration substrates simultaneously with the wafer. The detachable interconnecting structure permits easy replaceable of the wafer chuck with other wafer chucks having different metal plating, impedance characteristics or thermal characteristics, independently of the auxiliary chucks. The interconnecting structure also enables the adjustment of the elevations of the respective chuck supporting surfaces relative to each other to compensate for differences in substrate thicknesses between the wafer, contact substrate, and calibration substrate.

The modular chuck assembly is usable either with or without a controlled-environment enclosure. When used with such an enclosure, it eliminates the repeated opening and re-purging of the enclosure previously necessitated by repeated unloading and loading sequences associated with set-up, calibration and measurement. The independent vacuum-control valves of the respective auxiliary chucks are located remotely from the modular chuck assembly so that any controlled-environment enclosure will not interfere with the use of the auxiliary chucks.

The foregoing and other objectives, features, and advantages of the invention will be more readily understood upon consideration of the following detailed description of the invention, taken in conjunction with the accompanying drawings.

BRIEF DESCRIPTION OF THE DRAWINGS

FIG. 2A is a partial top view of the wafer probe station of FIG. 1 with the enclosure door shown partially open.

DESCRIPTION OF THE PREFERRED EMBODIMENT

Figure 1:
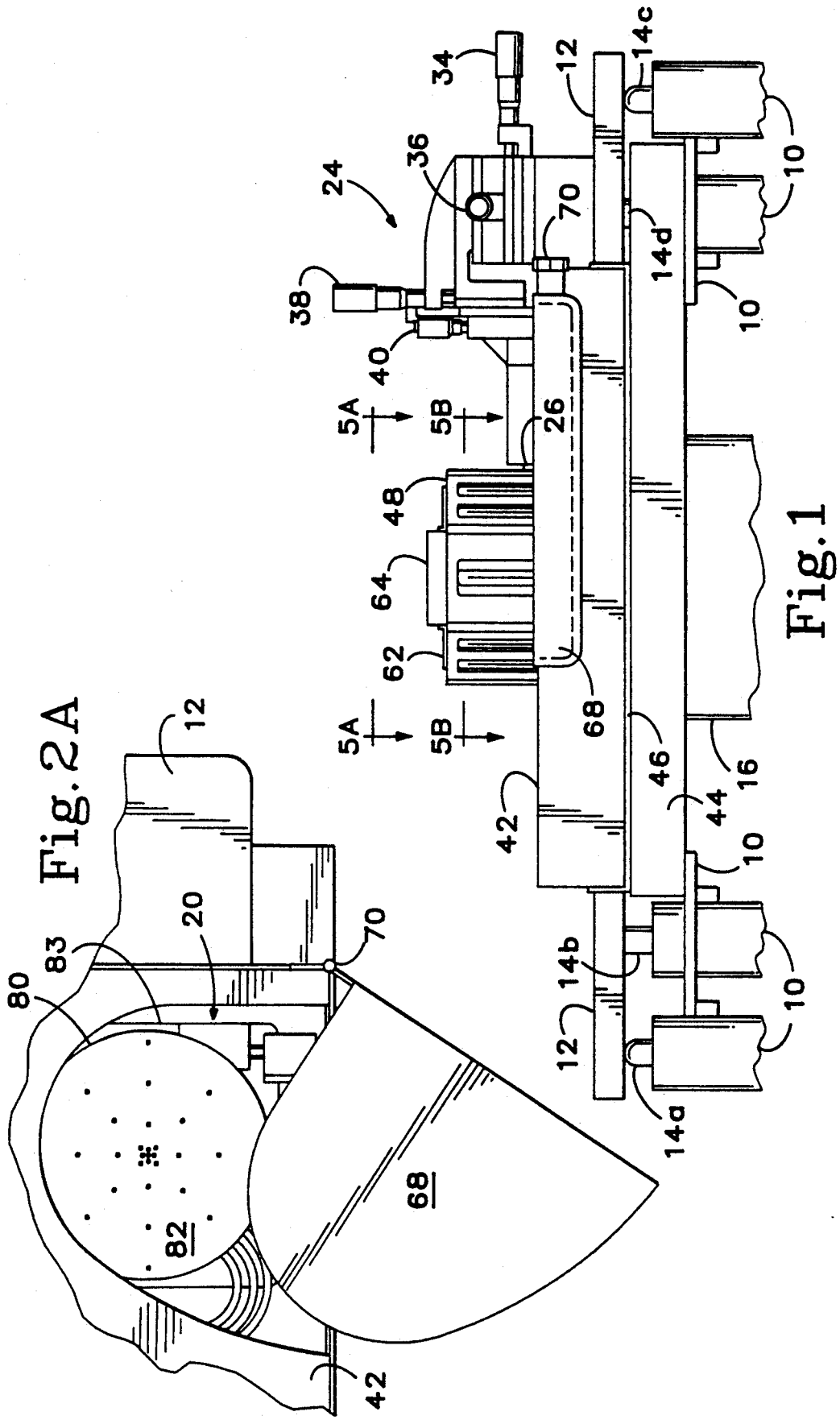
FIG. 1 is a partial front view of an exemplary embodiment of a wafer probe station constructed in accordance with the present invention.
Figure 2:
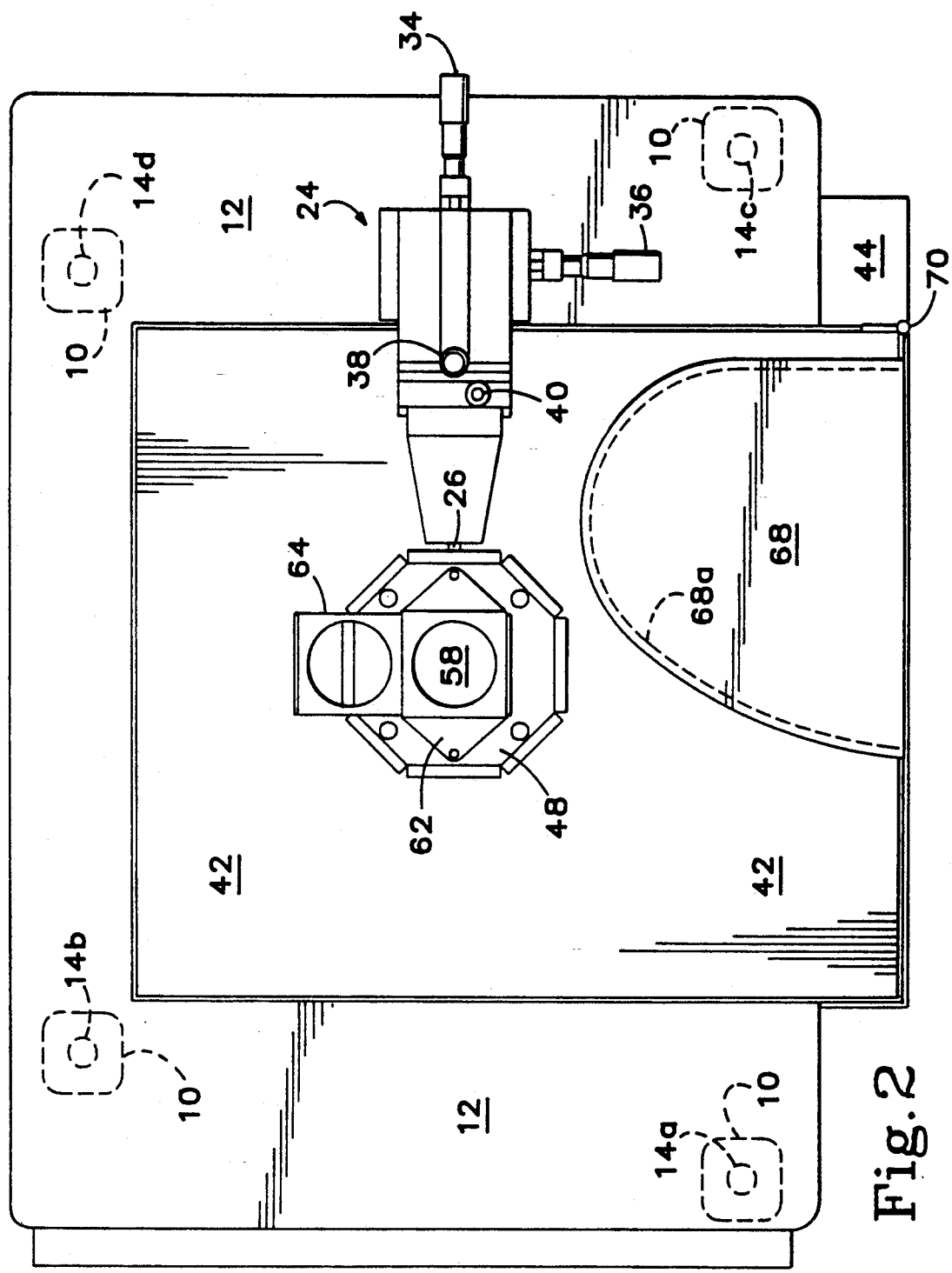
FIG. 2 is a top view of the wafer probe station of FIG. 1.
Figure 3:
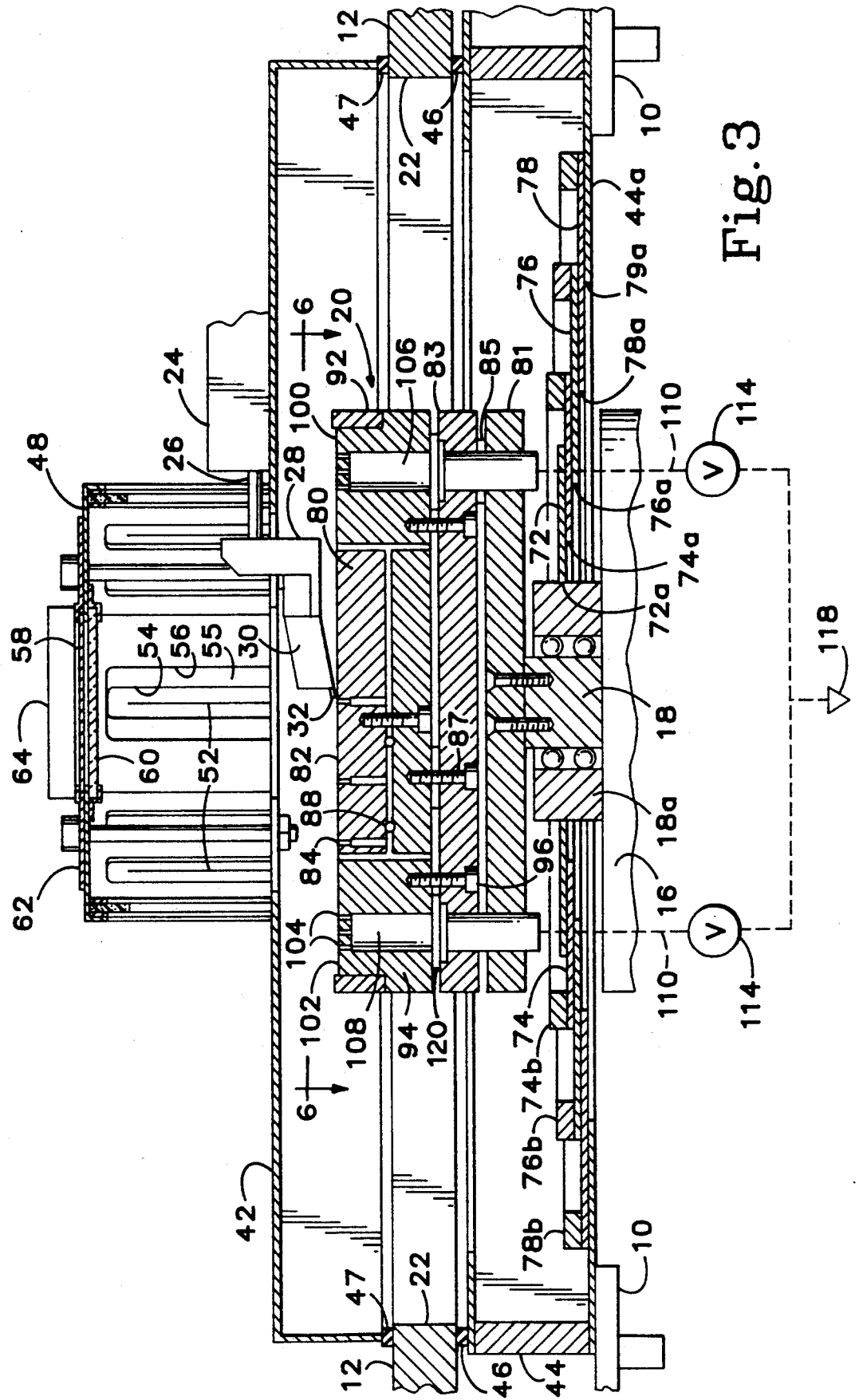
FIG. 3 is a partially sectional and partially schematic front view of the probe station of FIG. 1.

With reference to FIGS. 1, 2 and 3, an exemplary embodiment of the probe station of the present invention comprises a base 10 (shown partially) which supports a platen 12 through a number of jacks 14a, 14b, 14c, 14d which selectively raise and lower the platen vertically relative to the base by a small increment (approximately one-tenth of an inch) for purposes to be described hereafter. Also supported by the base 10 of the probe station is a motorized wafer positioner 16 having a rectangular plunger 18 which supports a movable chuck assembly 20. The chuck assembly 20 passes freely through a large aperture 22 in the platen 12 which permits the chuck assembly to be moved independently of the platen by the positioner 16 along X, Y and Z axes, i.e. horizontally along two mutually-perpendicular axes X and Y, and vertically along the Z axis. Likewise, the platen 12, when moved vertically by the jacks 14, moves independently of the chuck assembly 20 and the positioner 16.

Mounted atop the platen 12 are multiple individual probe positioners such as 24 (only one of which is shown), each having an extending member 26 to which is mounted a probe holder 28 which in turn supports a respective wafer probe 30. The wafer probe 30 has a downwardly-inclined coplanar transmission line probe tip 32 for contacting wafers and other test devices mounted atop the chuck assembly 20, although other kinds of tips can be used as well. The probe positioner 24 has micrometer adjustments 34, 36 and 38 for adjusting the position of the probe holder 28, and thus the probe 30, along the X, Y and Z axes respectively, relative to the chuck assembly 20. The Z axis is exemplary of what is referred to herein loosely as the "axis of approach" between the probe holder 28 and the chuck assembly 20, although directions of approach which are neither vertical nor linear, along which the probe tip and wafer or other test device are brought into contact with each other, are also intended to be included within the meaning of the term "axis of approach." A further micrometer adjustment 40 adjustably tilts the probe holder 28 so that the plane of the probe tip 32 can be made parallel to the plane of the wafer or other test device supported by the chuck assembly 20. As many as twelve individual probe positioners 24, each supporting a respective probe, may be arranged on the platen 12 around the chuck assembly 20 so as to converge radially toward the chuck assembly similarly to the spokes of a wheel. With such an arrangement, each individual positioner 24 can independently adjust its respective probe in the X, Y and Z directions, while the jacks 14 can be actuated to raise or lower the platen 12 and thus all of the positioners 24 and their respective probes in unison.

An environment control enclosure is composed of an upper box portion 42 rigidly attached to the platen 12, and a lower box portion 44 rigidly attached to the base 10. Both portions are made of steel or other suitable electrically conductive material to provide EMI shielding. To accommodate the small vertical movement between the two box portions 42 and 44 when the jacks 14 are actuated to raise or lower the platen 12, an electrically conductive resilient foam gasket 46, preferably composed of silver or carbon-impregnated silicone, is interposed peripherally at their mating juncture at the front of the enclosure and between the lower portion 44 and the platen 12 so that an EMI, substantially hermetic, and light seal are all maintained despite relative vertical movement between the two box portions 42 and 44. Even though the upper box portion 42 is rigidly attached to the platen 12, a similar gasket 47 is preferably interposed between the portion 42 and the top of the platen to maximize sealing.

Figure 5A:
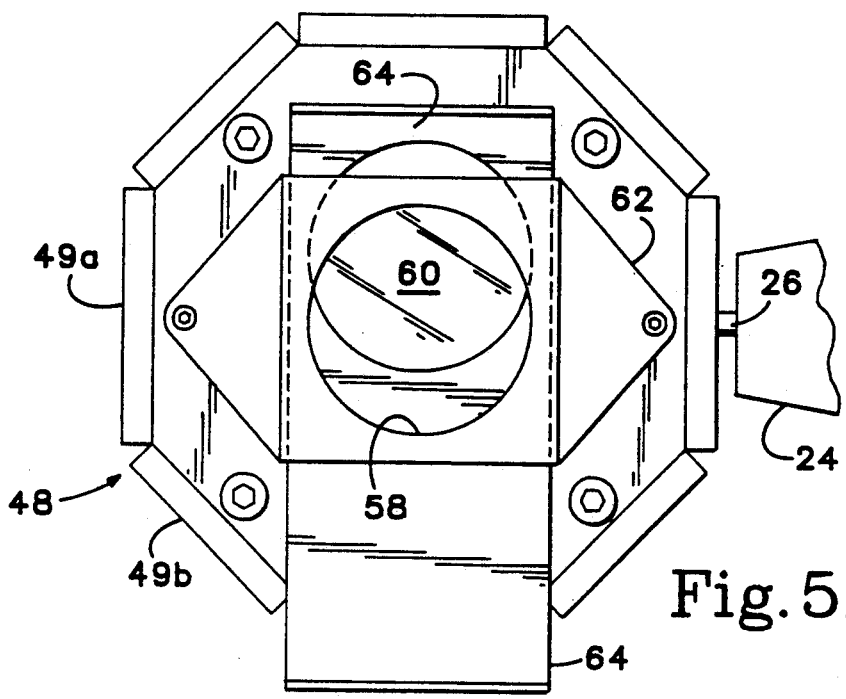
FIG. 5A is an enlarged top detail view taken along line 5A—5A of FIG. 1.
Figure 5B:
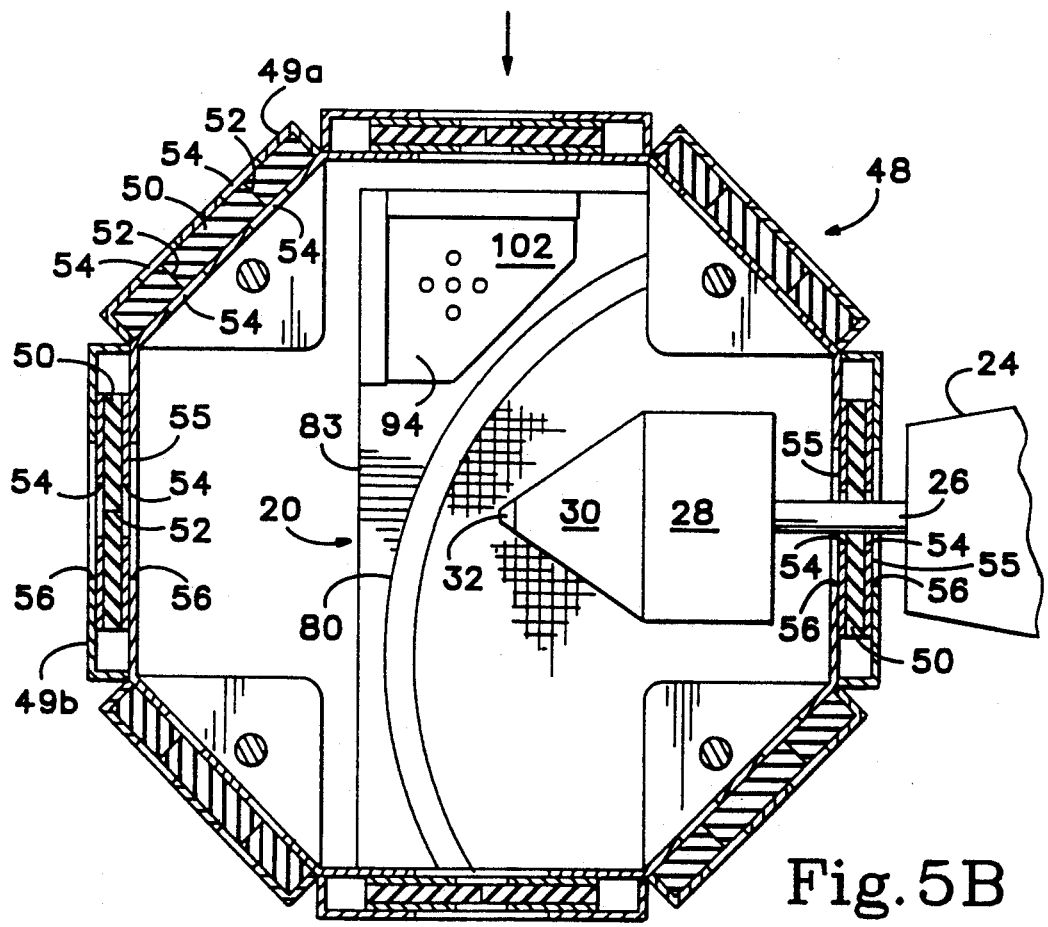
FIG. 5B is an enlarged top sectional view taken along line 5B—5B of FIG. 1.

With reference to FIGS. 5A and 5B, the top of the upper box portion 42 comprises an octagonal steel box 48 having eight side panels such as 49a and 49b through which the extending members 26 of the respective probe positioners 24 can penetrate movably. Each panel comprises a hollow housing in which a respective sheet 50 of resilient foam, which may be similar to the above-identified gasket material, is placed. Slits such as 52 are partially cut vertically in the foam in alignment with slots 54 formed in the inner and outer surfaces of each panel housing, through which a respective extending member 26 of a respective probe positioner 24 can pass movably. The slitted foam permits X, Y and Z movement of the extending members 26 of each probe positioner, while maintaining the EMI, substantially hermetic, and light seal provided by the enclosure. In four of the panels, to enable a greater range of X and Y movement, the foam sheet 50 is sandwiched between a pair of steel plates 55 having slots 54 therein, such plates being slidable transversely within the panel housing through a range of movement encompassed by larger slots 56 in the inner and outer surfaces of the panel housing.

Atop the octagonal box 48, a circular viewing aperture 58 is provided, having a recessed circular transparent sealing window 60 therein. A bracket 62 holds an apertured sliding shutter 64 to selectively permit or prevent the passage of light through the window. A stereoscope (not shown) connected to a CRT monitor can be placed above the window to provide a magnified display of the wafer or other test device and the probe tip for proper probe placement during set-up or operation. Alternatively, the window 60 can be removed and a microscope lens (not shown) surrounded by a foam gasket can be inserted through the viewing aperture 58 with the foam providing EMI, hermetic and light sealing.

The upper box portion 42 of the environment control enclosure also includes a hinged steel door 68 which pivots outwardly about the pivot axis of a hinge 70 as shown in FIG. 2A. The hinge biases the door downwardly toward the top of the upper box portion 42 so that it forms a tight, overlapping, sliding peripheral seal 68a with the top of the upper box portion. When the door is open, and the chuck assembly 20 is moved by the positioner 16 beneath the door opening as shown in FIG. 2A, the chuck assembly is accessible for loading and unloading.

Figure 4:
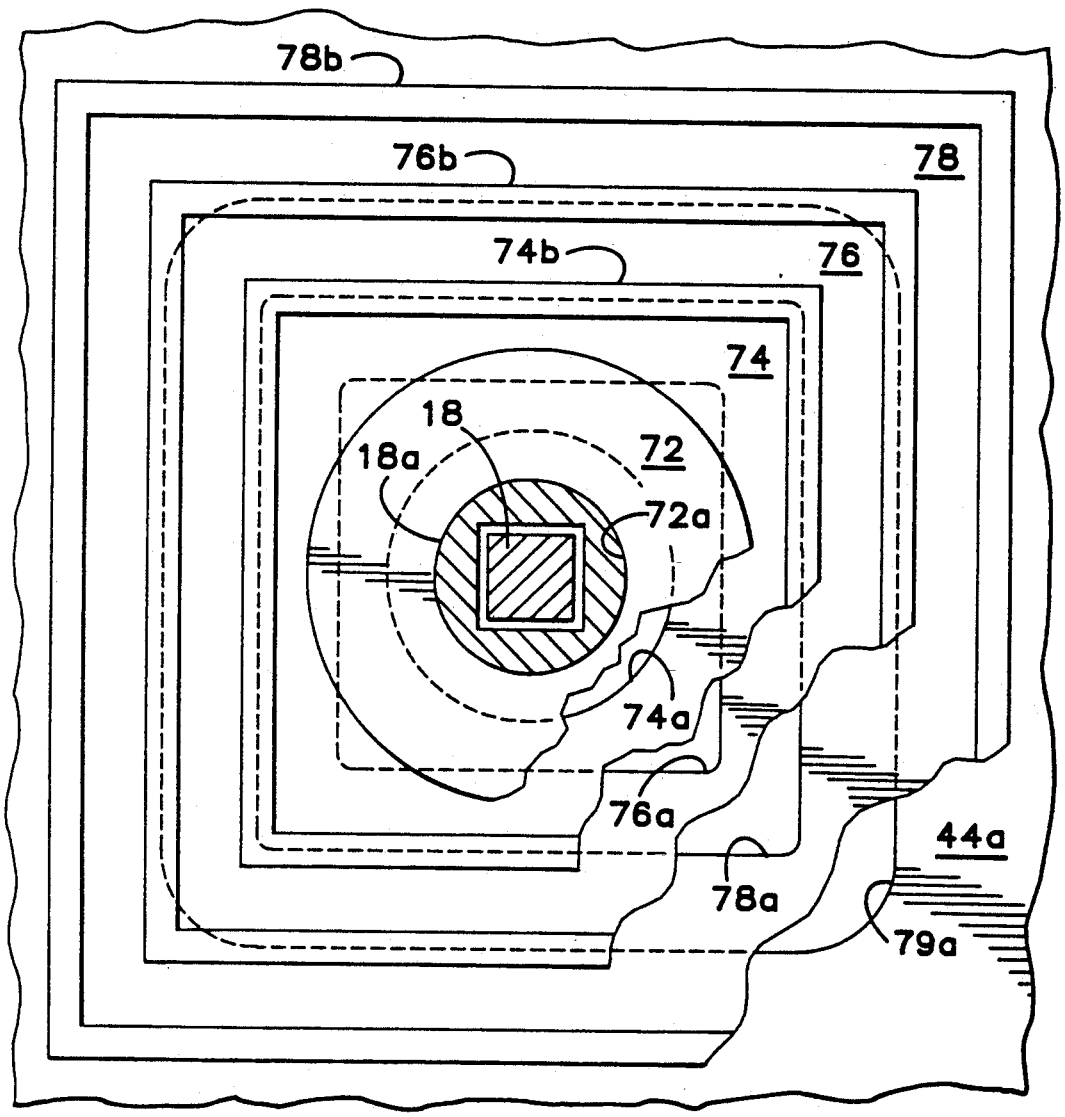
FIG. 4 is a top view of the sealing assembly where the wafer positioning mechanism extends through the bottom of the enclosure.

With reference to FIGS. 3 and 4, the sealing integrity of the enclosure is likewise maintained throughout positioning movements by the motorized positioner 16 due to the provision of a series of four sealing plates 72, 74, 76 and 78 stacked slidably atop one another. The sizes of the plates progress increasingly from the top to the bottom one, as do the respective sizes of the central apertures 72a, 74a, 76a and 78a formed in the respective plates 72, 74, 76 and 78, and the aperture 79a formed in the bottom 44a of the lower box portion 44. The central aperture 72a in the top plate 72 mates closely around the bearing housing 18a of the vertically-movable plunger 18. The next plate in the downward progression, plate 74, has an upwardly-projecting peripheral margin 74b which limits the extent to which the plate 72 can slide across the top of the plate 74. The central aperture 74a in the plate 74 is of a size to permit the positioner 16 to move the plunger 18 and its bearing housing 18a transversely along the X and Y axes until the edge of the top plate 72 abuts against the margin 74b of the plate 74. The size of the aperture 74a is, however, too small to be uncovered by the top plate 72 when such abutment occurs, and therefore a seal is maintained between the plates 72 and 74 regardless of the movement of the plunger 18 and its bearing housing along the X and Y axes. Further movement of the plunger 18 and bearing housing in the direction of abutment of the plate 72 with the margin 74b results in the sliding of the plate 74 toward the peripheral margin 76b of the next underlying plate 76. Again, the central aperture 76a in the plate 76 is large enough to permit abutment of the plate 74 with the margin 76b, but small enough to prevent the plate 74 from uncovering the aperture 76a, thereby likewise maintaining the seal between the plates 74 and 76. Still further movement of the plunger 18 and bearing housing in the same direction causes similar sliding of the plates 76 and 78 relative to their underlying plates into abutment with the margin 78b and the side of the box portion 44, respectively, without the apertures 78a and 79a becoming uncovered. This combination of sliding plates and central apertures of progressively increasing size permits a full range of movement of the plunger 18 along the X and Y axes by the positioner 16, while maintaining the enclosure in a sealed condition despite such positioning movement. The EMI sealing provided by this structure is effective even with respect to the electric motors of the positioner 16, since they are located below the sliding plates.

Figure 6:
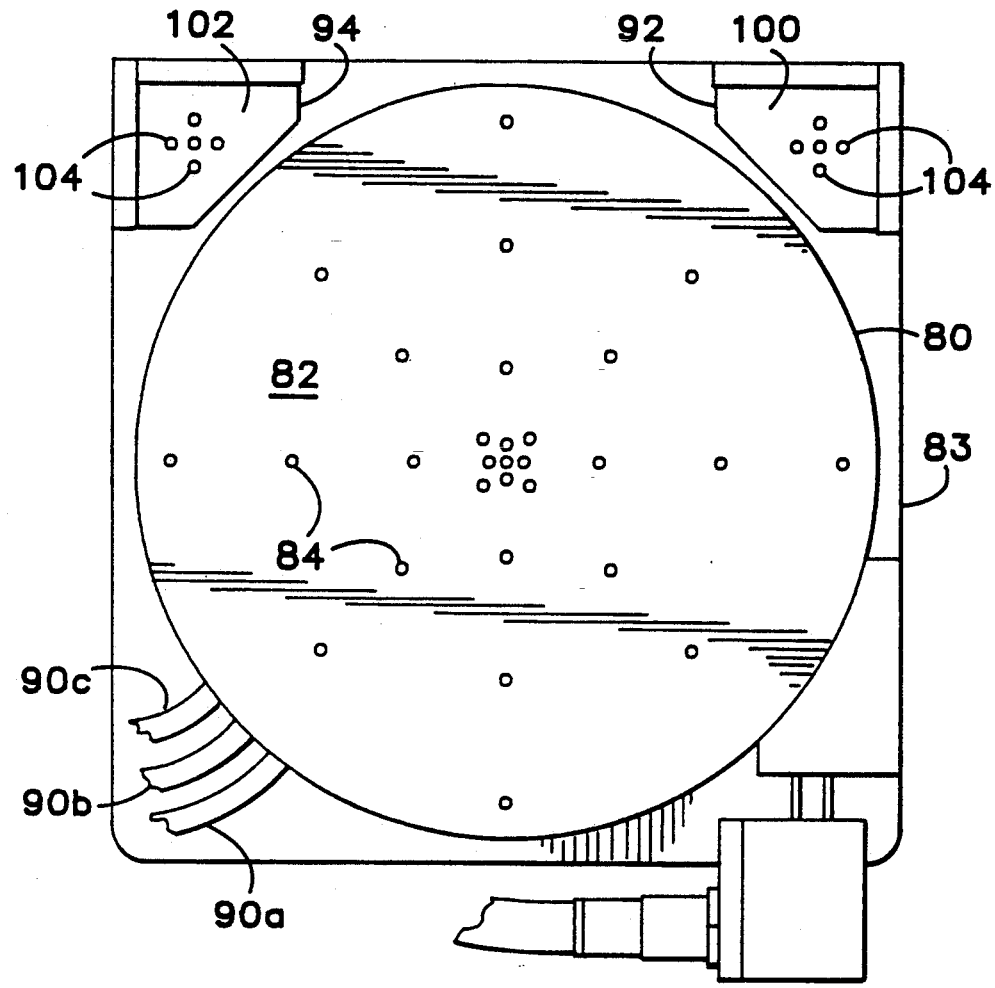
FIG. 6 is a top detail view of the chuck assembly, taken along line 6—6 of FIG. 3.

With particular reference to FIGS. 3 and 6, the chuck assembly 20 is of a unique modular construction usable either with or without an environment control enclosure. The plunger 18 supports an adjustment plate 81 which in turn supports a rectangular stage 83 which detachably mounts a circular wafer chuck 80 of conventional design by means of screws such as 87. Shims such as 85 providing leveling. The wafer chuck 80 has a planar upwardly-facing wafer-supporting surface 82 having an array of vertical apertures 84 therein. These apertures communicate with respective chambers separated by O-rings 88, the chambers in turn being connected separately to different vacuum lines 90a, 90b, 90c communicating through separately-controlled vacuum valves (not shown) with a source of vacuum. The respective vacuum lines selectively connect the respective chambers and their apertures to the source of vacuum to hold the wafer, or alternatively isolate the apertures from the source of vacuum to release the wafer, in a conventional manner. The separate operability of the respective chambers and their corresponding apertures enables the chuck to hold wafers of different diameters.

In addition to the circular wafer chuck 80, up to four auxiliary chucks such as 92 and 94 are detachably mounted on the corners of the stage 83 by screws such as 96 independently of the wafer chuck 80. Each auxiliary chuck 92, 94 has its own separate upwardly-facing planar surface 100, 102 respectively, in parallel relationship to the surface 82 of the wafer chuck 80. Vacuum apertures 104 protrude through the surfaces 100 and 102 from communication with respective chambers 106, 108 within the body of each auxiliary chuck. Each of these chambers in turn communicates through a separate vacuum line 110 and a separate independently-actuated vacuum valve 114 with a source of vacuum 118 as shown schematically in FIG. 3. Each of the valves 114 selectively connects or isolates a respective chamber 106 or 108 with respect to the source of vacuum independently of the operation of the apertures 84 of the wafer chuck 80, so as to selectively hold or release a contact substrate or calibration substrate located on the respective surfaces 100 and 102 of the auxiliary chucks independently of the wafer.

The detachable interconnection of the auxiliary chucks 92 and 94 with respect to the wafer chuck 80 enables not only the independent replacement of the different chucks but also enables the respective elevations of the surfaces of the chucks to be adjusted vertically with respect to each other. As shown in FIG. 3, auxiliary chuck shims such as 120 can be inserted between the stage 83 and the auxiliary chuck to adjust the elevation of the auxiliary chuck's upper surface relative to that of the wafer chuck 80 and the other auxiliary chuck(s). This compensates for any differences in thicknesses between the wafer, contact substrate and calibration substrate which are simultaneously carried by the chuck assembly 20, so that the probes are easily transferable from one to the other without differences in contact pressure or the threat of damage to the probe tips.

When used with an environment control enclosure, the vacuum valves 114 of the respective auxiliary chucks are located remotely from the chucks, and preferably exterior of the enclosure as indicated schematically in FIG. 3 to enable control of the auxiliary chucks despite the impediment to access created by the enclosure. This enables use of auxiliary chucks compatibly with such an enclosure, which is particularly critical because the presence of the auxiliary chucks eliminates the need for repetitive unloading and loading of contact substrates and calibration substrates during set-up and calibration, and thus eliminates the attendant need for repetitive and time-consuming purging of the environment control enclosure. The modular, detachably interconnected chuck assembly is also particularly advantageous when combined with a controlled-environment probe station because of the need for interchangeability of the numerous different types of wafer chucks usable with such a probe station.

The terms and expressions which have been employed in the foregoing specification are used therein as terms of description and not of limitation, and there is no intention, in the use of such terms and expressions, of excluding equivalents of the features shown and described or portions thereof, it being recognized that the scope of the invention is defined and limited only by the claims which follow.

What is claimed is:

1. A probe station comprising:
   (a) a substantially planar first surface having first apertures therein, and means for selectively connecting or isolating said first apertures with respect to a source of vacuum so as to selectively hold or release a test device on said first surface;
   (b) at least one substantially planar second surface connected to said first surface in substantially parallel relationship thereto, said second surface having second apertures therein, and means for selectively connecting or isolating said second apertures with respect to a source of vacuum independently of said first apertures so as to selectively hold or release a substrate on said second surface independently of any holding or releasing of said test device on said first surface;
   (c) a holder for an electrical probe for contacting the test device and the substrate;
   (d) a positioning mechanism for selectively, alternatively causing contact of either the test device, while on said first surface, or the substrate, while on said second surface, with said electrical probe while said probe is held by said holder; and
   (e) connection apparatus detachably interconnecting said first surface and said second surface for enabling replacement of said first surface independently of said second surface.

2. The probe station of claim 1 wherein said connection apparatus includes means for enabling replacement of either said first surface or said second surface independently of the other.

3. A probe station comprising:
   (a) a substantially planar first surface having first apertures therein, and means for selectively connecting or isolating said first apertures with respect to a source of vacuum so as to selectively hold or release a test device on said first surface;
   (b) at least one substantially planar second surface connected to said first surface in substantially parallel relationship thereto, said second surface having second apertures therein, and means for selectively connecting or isolating said second apertures with respect to a source of vacuum independently of said first apertures so as to selectively hold or release a substrate on said second surface independently of any holding or releasing of said test device on said first surface;

(c) a holder for an electrical probe for contacting the test device and the substrate;

(d) a positioning mechanism for selectively, alternatively causing contact of either the test device, while on said first surface, or the substrate, while on said second surface, with said electrical probe while said probe is held by said holder; and (e) adjustment apparatus adjustably interconnecting said first surface and said second surface for enabling the position of one of said surfaces to be adjusted relative to the position of the other of said surfaces.

4. The probe station of claim 3, further including connection apparatus detachably interconnecting said first surface and said second surface for enabling replacement of said first surface independently of said second surface.

5. The probe station of claim 4 wherein said connection apparatus includes means for enabling replacement of either said first surface or said second surface independently of the other.

6. A probe station comprising:

(a) a substantially planar first surface having first apertures therein, and means for selectively connecting or isolating said first apertures with respect to a source of vacuum so as to selectively hold or release a test device on said first surface;

(b) at least one substantially planar second surface connected to said first surface in substantially parallel relationship thereto, said second surface having second apertures therein, and a valve for selectively connecting or isolating said second apertures with respect to a source of vacuum independently of said first apertures so as to selectively hold or release a substrate on said second surface independently of any holding or releasing of said test device on said first surface;

(c) a holder for an electrical probe for contacting the test device and the substrate;

(d) a positioning mechanism for selectively, alternatively causing contact of either the test device, while on said first surface, or the substrate, while on said second surface, with said electrical probe while said probe is held by said holder; and (e) a sealing enclosure surrounding said first second surfaces.

7. The probe station of claim 6 wherein said enclosure includes means for substantially hermetically sealing said first and second surfaces.

8. The probe station of claim 6 wherein said enclosure includes means for sealing said first and second surfaces from electromagnetic interference.

9. The probe station of claim 6 wherein said valve is located outside of said enclosure.

10. The probe station of claim 6 wherein said valve is located remotely from said first and second surfaces.

11. The probe station of claim 1 wherein said positioning mechanism includes means for moving said first and second surfaces in unison between a first position where said probe can contact said test device and a second position where said probe can contact said substrate.

12. The probe station of claim 3 wherein said positioning mechanism includes means for moving said first and second surfaces in unison between a first position where said probe can contact said test device and a second position where said probe can contact said substrate.

13. The probe station of claim 6 wherein said positioning mechanism includes means for moving said first and second surfaces in unison between a first position where said probe can contact said test device and a second position where said probe can contact said substrate.

* * * * *

UNITED STATES PATENT AND TRADEMARK OFFICE
CERTIFICATE OF CORRECTION

PATENT NO. : 5,237,267

DATED : August 17, 1993

INVENTOR(S) : Warren K. Harwood et al.

It is certified that error appears in the above-identified patent and that said Letters Patent is hereby corrected as shown below:

Col. 1, line 62, Change "replaceable" to --replaceability--.

Col. 8, line 10, After "first" insert --and--.

Signed and Sealed this

Eighth Day of March, 1994

*Attest:*

BRUCE LEHMAN

*Attesting Officer*  *Commissioner of Patents and Trademarks*